(12) United States Patent
Burger et al.

(10) Patent No.: US 11,528,005 B2
(45) Date of Patent: Dec. 13, 2022

(54) ELECTRICAL FILTER ELEMENT AND ELECTRICAL POWER CONVERTER

(71) Applicant: Robert Bosch GmbH, Stuttgart (DE)

(72) Inventors: Dennis Burger, Friolzheim (DE); Heiner Jacobs, Baden-Baden (DE); Konstantin Spanos, Nagold (DE); Wolfram Kienle, Magstadt (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 17/058,319

(22) PCT Filed: May 13, 2019

(86) PCT No.: PCT/EP2019/062156
§ 371 (c)(1),
(2) Date: Nov. 24, 2020

(87) PCT Pub. No.: WO2019/224029
PCT Pub. Date: Nov. 28, 2019

(65) Prior Publication Data
US 2021/0203299 A1 Jul. 1, 2021

(30) Foreign Application Priority Data
May 25, 2018 (DE) ..................... 10 2018 208 313.4

(51) Int. Cl.
*H03H 7/01* (2006.01)
*H01F 27/08* (2006.01)
(Continued)

(52) U.S. Cl.
CPC ........... *H03H 7/0115* (2013.01); *H01F 27/08* (2013.01); *H01F 27/24* (2013.01); *H05K 1/0243* (2013.01);
(Continued)

(58) Field of Classification Search
CPC ........ H03H 7/0115; H01F 27/08; H01F 27/24
(Continued)

(56) References Cited

U.S. PATENT DOCUMENTS

| | | | |
|---|---|---|---|
| 2010/0013589 A1 | 1/2010 | Schaffer et al. | |
| 2013/0207763 A1* | 8/2013 | Wagoner | H01F 27/22 336/60 |
| 2017/0018349 A1 | 1/2017 | Otsubo et al. | |

FOREIGN PATENT DOCUMENTS

DE 102010054005 6/2012

OTHER PUBLICATIONS

International Search Report for Application No. PCT/EP2019/062156 dated Jul. 12, 2019 (English Translation, 2 pages).

* cited by examiner

*Primary Examiner* — Rakesh B Patel
(74) *Attorney, Agent, or Firm* — Michael Best & Friedrich LLP

(57) ABSTRACT

The invention relates to an electrical filter element (1) for filtering alternating voltage interference. The electrical filter element (1) comprises two dielectric circuit board substrates (11, 12) having a magnetic core (13) arranged between the circuit board substrates. The magnetic core (13) has a material-free inner region (13*a*), in which electrical connection elements (21-24) are provided between the two dielectric circuit board substrates (11, 12). Furthermore, electrical connection elements (31, 32) can also be provided between the two dielectric circuit board substrates (11, 12) in an outer region of the magnetic core (13).

18 Claims, 3 Drawing Sheets

(51) Int. Cl.
   *H01F 27/24* (2006.01)
   *H05K 1/02* (2006.01)
(52) U.S. Cl.
   CPC ............. *H05K 2201/1003* (2013.01); *H05K 2201/1006* (2013.01); *H05K 2201/10015* (2013.01)
(58) Field of Classification Search
   USPC ................................................ 333/175, 185
   See application file for complete search history.

ELECTRICAL FILTER ELEMENT AND ELECTRICAL POWER CONVERTER

BACKGROUND OF THE INVENTION

The present invention relates to an electrical filter element and an electrical power converter having an electrical filter element of this type.

Electrical power converters, in particular inverters, are used in numerous technical fields. For example, inverters of this type are used in electrical drive systems of electric vehicles or hybrid vehicles. The inverters used in this case, in particular clocked inverters such as pulse-controlled inverters (PCI), for example, naturally electrically generate common-mode interferences and differential mode interferences. In order to minimize these interferences, suitable filter apparatuses must typically be provided which reduce the emission of interference variables in the direction of a supply network, such as the high-voltage network of an electric vehicle, for example. There already exist numerous guidelines and regulations for this purpose, which specify a maximum permissible emission of interferences.

Printed document DE 10 2010 054 005 A1 discloses an electrical apparatus with an inverter and an EMC filter. The EMC filter comprises interference suppression capacitors and a common-mode suppression choke with a magnetically active core. The common-mode connections of the inverter are connected to power supply connections via the common-mode suppression choke and connected to a ground connection via the interference suppression capacitors.

SUMMARY OF THE INVENTION

According to the invention, there is provided:
an electrical filter element having a first dielectric printed circuit board substrate, a second dielectric printed circuit board substrate, an annular magnetic core and a first number of internal electrical connection elements. The annular magnetic core is arranged between the first printed circuit board substrate and the second printed circuit board substrate. The internal electrical connection elements are arranged in an inner region of the annular magnetic core. In this case, each internal electrical connection element is in particular designed to electrically connect an electrical connecting point on the first printed circuit board substrate to a corresponding electrical connecting point on the second printed circuit board substrate.

There is further provided:
an electrical power converter having an electrical filter element according to the invention.

The present invention is based on the finding that electrical power converters, such as pulse-controlled inverters, for example, can naturally cause electrical common-mode interferences and differential mode interferences. Specially adapted filter apparatuses are typically required in order to reduce these interferences. Conventionally configured filter apparatuses require great conceptual effort. The filter apparatuses for minimizing common-mode interferences and differential mode interferences therefore lead to high costs and are typically also associated with significant requirements for installation space.

One idea of the present invention is therefore to take this finding into account and to provide an electrical filter element which makes it possible to filter AC voltage components on a DC voltage line in an efficient manner. For this purpose, the present invention creates an inductive component which makes it possible to filter AC voltage components with limited installation space volume, owing to its special structure. The special structural configuration of the filter element enables a very good basis for connecting elements to electrically connect the filter element to further assemblies at the input and output, owing to the dielectric printed circuit boards used. Moreover, owing to the special arrangement of the magnetic core between the two printed circuit boards, a current path can be realized which corresponds to an inductive component with a plurality of electrical windings.

In this way, the inductance of the filter element can be adapted. As a result, the filter properties of the component for filtering AC voltage components are improved. A high inductance can thus be realized in a small installation space, which makes it possible to filter the AC voltage components in an efficient manner in the case of limited installation space volume.

Moreover, the printed circuit board substrates used provide an excellent basis for arranging further components. In particular, additional components can be attached to the printed circuit boards. These additional components can also be used for filtering interferences. In this case, the additional components on the individual printed circuit boards, as well as the magnetic core and the wiring between the individual printed circuit boards, can be adapted to the respective requirements. In this way, the filter properties can always be adapted in an optimal manner depending on the application.

The first and the second dielectric printed circuit board substrate can in each case be any printed circuit board substrate. In particular, conventional printed circuit board substrates can be used, for example, as they are used in the field of printed circuits, for example. Support substrates form the basis for dielectric printed circuit board substrates of this type from an electrically non-conductive material, for example, such as epoxy resin or the like, for example.

If further electrically conductive structures are to be attached to the dielectric printed circuit board substrates, these can be made from electrically conductive copper, silver or a different electrically conductive material, for example. The electrically conductive structures can connect the individual connection elements of the electrical filter element to one another in a suitable manner, for example. Moreover, further components, such as capacitors, electrical resistors or electrical connecting elements, for example, can also be contacted by way of the conductive structures. The electrically conductive structures on the dielectric printed circuit board substrates can be attached either to the sides which face away from the magnetic core or to the sides of the printed circuit board substrate which face the magnetic core. It is also fundamentally possible to respectively attach electrically conductive structures both to the sides of the printed circuit board substrate which face the magnetic core and to the sides of the printed circuit board substrate which face away from the magnetic core.

The annular magnetic core can be any magnetic core. In this case, the magnetic core has an inner region which is free from material. The annular magnetic core can thus be shaped as a hollow cylinder, a toroid, or the like, for example. The magnetic core does not necessarily have to have a circular external geometry in this case. Rectangular or square cross sections with an inner region which is free from material are also possible as a magnetic core, for example. Moreover, the magnetic core can of course also have any other structure which has an inner region which is free from material.

The electrical connection elements can be any electrically conductive elements which are designed to provide an electrically conductive connection between the two dielectric printed circuit board substrates. In particular, the internal electrical connection elements are arranged in the inner region of the magnetic core which is free from material. For example, the electrical connection elements can be electrically conductive rods, for example rod-shaped elements made of an electrically conductive metal. It is understood that an individual electrically conductive connection element can also consist of a plurality of individual connection elements which are arranged in parallel, in order to increase the current carrying capacity, for example. The connection elements can be soldered, welded or electrically connected in any other way to the connecting points on the printed circuit board substrates, for example. It is also possible to contact by means of a pressing method or the like, for example.

Owing to the arrangement according to the invention of the electrical filter element, an electrical current flow is realized from the first dielectric printed circuit board substrate through the inner region of a magnetic core to a second dielectric printed circuit board substrate. In this way, an inductive component can be created which makes the above-described advantages possible.

According to an embodiment, the electrical filter element comprises a second number of external electrical connection elements. The external electrical connection elements are arranged in an outer region of the annular magnetic core. Each external electrical connection element is designed to electrically connect a respective connecting point on the first printed circuit board substrate to a corresponding connecting point on the second printed circuit board substrate. Moreover, the first printed circuit board substrate can have a first electrically conductive structure, and the second printed circuit board substrate can have a second electrically conductive structure. The first electrically conductive structure can couple a respective connecting point of an internal electrical connection element to a connecting point of a corresponding external electrical connection element. Similarly, the second electrically conductive structure can be designed to electrically couple a respective connecting point of an external electrical connection element to a corresponding connecting point of a further internal electrical connection element. In this way, an electrical wiring structure can be created at the magnetic core which in each case corresponds to a plurality of windings around the magnetic core. In particular, for a direct current, the electrical current in the inner region of the magnetic core can in each case flow in a first direction, and in the outer region in a second, opposite direction. This makes it possible to create an electrical filter element which in each case has a plurality of windings for the inductance of the filter element.

According to an embodiment, the electrical filter element comprises a first capacitor which is arranged on the first dielectric printed circuit board substrate. The first capacitor can be electrically coupled to a first internal connection element at a first connection and to a second internal connection element at a second connection. In this way, a capacitance can be provided between two internal electrical connection elements of the filter element. This capacitance can also be used for filtering AC voltage interferences. Similarly, it is also possible to provide a further capacitor on the second dielectric printed circuit board substrate which is also arranged between two internal connection elements. Capacitors of this type are also described as X capacitors.

According to an embodiment, the electrical filter element comprises a second capacitor and a third capacitor. The second capacitor can be arranged on the first dielectric printed circuit board substrate, and can be electrically coupled to a first internal connection element at a first connection and also can be electrically coupled to a reference potential by way of a second connection. Similarly, the third capacitor can also be arranged on the first dielectric printed circuit board substrate. The third capacitor can be electrically coupled to a second internal connection element by way of a first connection and also can be electrically coupled to a reference potential by way of a second connection. In this way, capacitors, so-called Y capacitors, can be provided between individual internal connection elements and a reference potential. These also make it possible to filter AC voltage interferences.

Similarly to the described arrangement of the Y capacitors on the first dielectric printed circuit board substrate, Y capacitors or X capacitors can additionally or alternatively be arranged on the second dielectric printed circuit board substrate.

The individual printed circuit board substrates can be individually assembled corresponding to the respective application by using the filter capacitors on the dielectric printed circuit board substrate. This makes it possible to construct the filter elements in a flexible and modular manner for each different application.

According to an embodiment, the first printed circuit board substrate comprises a first connecting device with a plurality of connecting elements. The connecting device can be designed to be connected to an electrical voltage source. In particular, each connecting element of the connecting device can be electrically coupled to an internal connection element. For example, the connecting device can have two connecting elements which can be electrically connected to the respective connecting elements of a DC voltage source.

According to an embodiment, the inner region of the annular magnetic core is filled with a dielectric filling material. The filling material can be a dielectric casting compound, for example, such as a synthetic resin or the like, for example. Filling the inner region of the annular core can, on the one hand, increase the stability of the electrical filter element. In addition, the dielectric filling material can serve to improve heat dissipation of the filter element.

According to an embodiment, the magnetic core has a closed annular structure. For example, the magnetic core can be designed as a toroidal or hollow-cylindrical component. In particular, the magnetic core can be realized from one single material piece.

According to a further embodiment, the magnetic core has at least one air gap. Additionally or alternatively, the magnetic core can also comprise ferromagnetic particles which are separated from one another. A core of this type with ferromagnetic particles which are separated from one another is also described as a core with a so-called distributed air gap. The inductive properties of the electrical filter element can be correspondingly adapted by discrete or distributed air gaps.

According to an embodiment, the electrical filter element comprises a cooling device. The cooling device can be thermally coupled to the magnetic core. In particular, the cooling device can be designed to cool the magnetic core and/or the internal and external connection elements and/or the further components on the dielectric printed circuit board substrates. The cooling device can be both an active or alternatively a passive cooling device. In particular, air-cooled or liquid-cooled cooling devices are possible, for example.

The preceding configurations and developments can, as far as reasonable, be combined with one another as desired. Further possible configurations, developments and implementations of the invention also comprise combinations of features of the invention, described previously or subsequently with respect to the exemplary embodiments, which are not explicitly mentioned. In particular, the person skilled in the art will also incorporate individual aspects as improvements or supplements to the respective basic shape of the invention.

BRIEF DESCRIPTION OF THE DRAWINGS

The present invention is explained in greater detail hereinafter using the exemplary embodiments specified in the schematic figures of the drawings. In the drawings.

DETAILED DESCRIPTION

Figure 1:
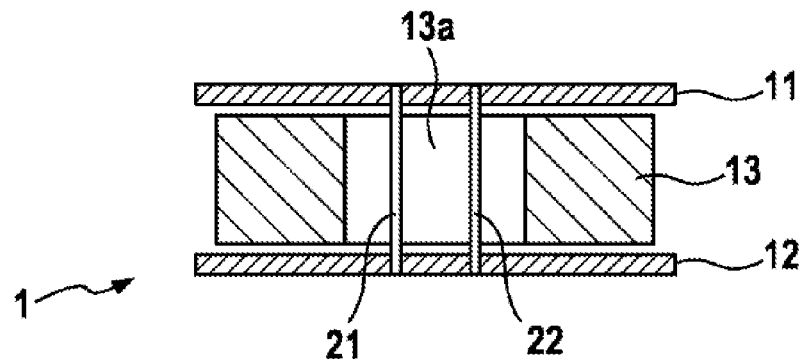
FIG. 1: shows a cross section through an electrical filter element according to an embodiment.

FIG. 1 shows a cross section through an electrical filter element 1 according to an embodiment. The filter element 1 comprises a first dielectric printed circuit board substrate 11 and a second dielectric printed circuit board substrate 12. In this case, the dielectric printed circuit board substrates 11, 12 can be any printed circuit board substrate, as is used for printed circuits or the like, for example. The printed circuit board substrate can be designed based on a synthetic resin or the like, for example. An annular magnetic core 13 is arranged between the first printed circuit board substrate 11 and the second printed circuit board substrate 12. The annular magnetic core 13 has an inner region 13a which is free from material. Furthermore, the filter element 1 comprises a number of one or a plurality of internal connection elements 21, 22. Preferably, the filter element 1 comprises a plurality of internal connection elements 21, 22. In particular in DC voltage applications, the filter element 1 can have an even number of internal connection elements 21, 22. In this way, an equal number of internal connection elements 21, 22 can be allocated to each positive and negative polarity.

The arrangement depicted in FIG. 1 thus enables an electrical current flow between the first dielectric printed circuit board substrate 11 and the second dielectric printed circuit board substrate 12 through the inner region 13a of the magnetic core 13. The inner region 13a of the magnetic core 13 can optionally be filled with a dielectric filling material (not depicted here). For example, the inner region 13a of the magnetic core 13 can be filled with a dielectric casting compound, such as a synthetic resin or the like, for example. The arrangement can thereby be mechanically stabilized, for example. Moreover, the dielectric filling material can optionally increase heat dissipation, in particular of the internal connection elements 21, 22.

Figure 2:
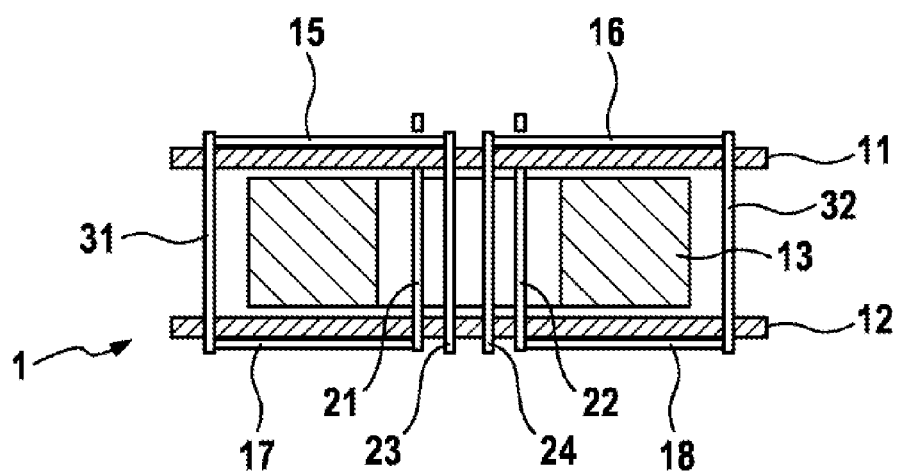
FIG. 2: shows a cross section through an electrical filter element according to a further embodiment.

FIG. 2 shows a schematic depiction of a cross section through an electrical filter element 1 according to a further embodiment. The remarks made previously in relation to FIG. 1 also apply to the embodiment depicted in FIG. 2.

In addition to the internal connection elements 21-24, the filter element 1 according to FIG. 2 also comprises external connection elements 31, 32. In this case, a respective internal connection element 21, 22 can be electrically connected to a corresponding external connection element 31, 32 on the second dielectric printed circuit board substrate 12. This can be realized by means of a suitable electrical conductor track structure on the second dielectric printed circuit board substrate 12, for example. Moreover, each external electrical connection element 31, 32 can be electrically connected to a respective further corresponding internal connection element 23, 24 by means of a suitable electrical conductor track structure on the first dielectric printed circuit board substrate 11. The electrical connections between the internal connection elements 21-24 and the electrically conductive structures 15-18 on the dielectric printed circuit board substrates 11, 12 as well as the external connection elements 31, 32 can take place in any manner. For example, they can be realized by means of a solder connection, by means of a welding connection or also by means of a press-fit connection or the like.

In this way, a current path via a plurality of windings around the magnetic core 13 can be realized in each case by means of an internal connection element 21, 22, an electrically conductive structure 17, 18 on the second dielectric printed circuit board substrate 12, an external electrical connection element 31, 32, a further electrically conductive structure 15, 16 on the first dielectric printed circuit board substrate 11 as well as a further internal electrical connection element 23, 24. The current flow is not limited in this case to the path depicted here with two windings—the number of internal connection elements 21-24 is critical when considering the windings. In fact, more than two windings can also be realized by correspondingly connecting multiple internal and external connection elements. For example, a current path can also be realized with three internal connection elements and two external connection elements, for example, or in general terms by means of n internal connection elements and n–1 external connection elements. In particular, in DC voltage applications, two corresponding connection paths can be realized for each positive and negative connection, as depicted in FIGS. 1 and 2.

Figure 3:
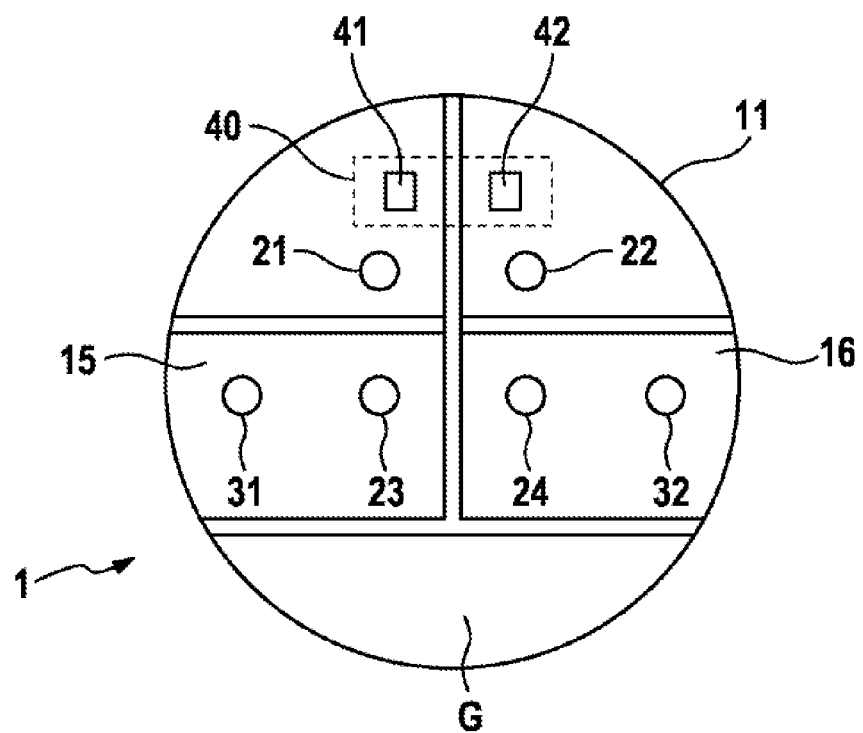
FIG. 3: shows a plan view of an electrical filter element according to an embodiment.

FIG. 3 shows a schematic depiction of a plan view of a filter element 1 according to an embodiment. The filter element 1 comprises a connecting device 40 with a first connecting element 41 and a second connecting element 42. The positive and the negative connection of a DC voltage source can be connected to the connecting elements 41 and 42, for example. Moreover, a reference potential can be connected in a region G. The first connecting element 41 of the connecting device 40 is electrically coupled to an internal connection element 21. Similarly, the second connecting element 42 of the connecting device 40 is electrically coupled to a further internal connection element 22. The first internal connection element 21 is electrically connected to a first external connection element 31 on the second dielectric printed circuit board substrate 12 which is not depicted here. Similarly, the second internal connection element 22 is electrically connected to a second external connection element 32.

Furthermore, the first external connection element 31 is electrically connected to a third internal connection element 23 on the first dielectric printed circuit board substrate 11, as depicted here, and the second external connection element 32 is electrically connected to the fourth internal connection element 24 on the first dielectric printed circuit board substrate 11.

Figure 4:
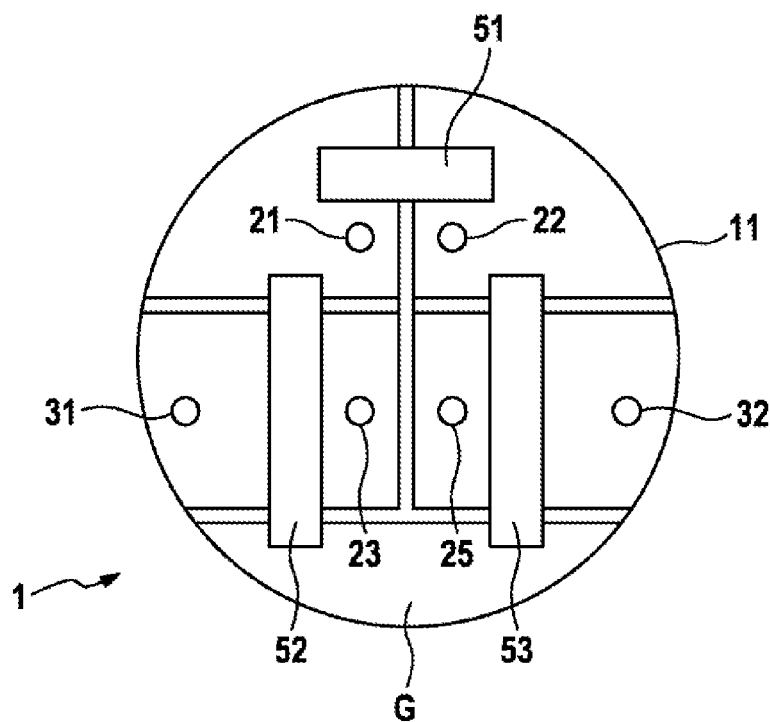
FIG. 4: shows a plan view of an electrical filter element according to a further embodiment.

FIG. 4 shows a schematic depiction of a plan view of the filter element 1 according to a further embodiment. The remarks made previously in relation to FIG. 3 also apply to the embodiment depicted in FIG. 4. Moreover, it can be recognized in FIG. 4 that further components can be arranged on the first printed circuit board substrate 11.

A first filter capacitor 51 can be arranged between a positive connection 41 and a negative connection 42 of the filter element 1, for example. A capacitor of this type is described as an X capacitor, for example. Furthermore, a respective second or third filter capacitor 52, 53 can also be arranged between the positive connection 41 and the reference potential G as well as between the negative connection 42 and the reference potential G, for example. Capacitors of this type are also described as Y capacitors, for example. Moreover, further components, in particular further capacitors, resistors or the like, are of course also possible on the first printed circuit board substrate 11.

Similarly to the components on the first printed circuit board substrate 11, further components, in particular filter capacitors or the like, can additionally or alternatively also be provided on the second printed circuit board substrate 12. In particular, identical or similar components can in each case be provided on the first printed circuit board substrate 11 and on the second printed circuit board substrate 12 for a symmetrical structure.

In this way, a filter element 1 according to the invention can be realized in a simple manner by simply combining a first dielectric printed circuit board substrate 11 with components which have already been attached previously, a second dielectric printed circuit board substrate 12 with components which have also been attached previously, as well as the magnetic core 13 and the connection elements 21-24 and 31, 32.

Figure 5:
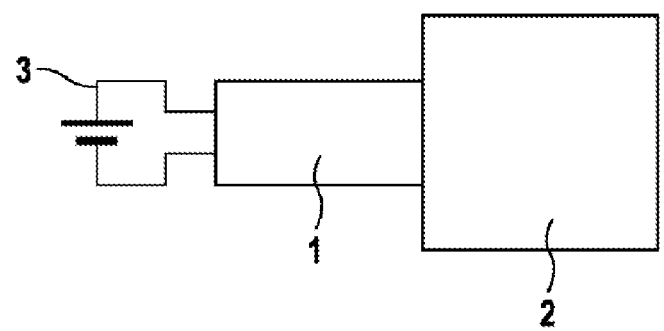
FIG. 5 shows a schematic depiction of a block diagram of an electrical power converter with a filter element according to an embodiment.

FIG. 5 shows a schematic depiction of a block diagram of an electrical power converter 2 with an electrical filter element 1, as has already been explained in the embodiments described previously. The filter element 1 can be electrically coupled to an electrical DC voltage source 3 by way of connections on the first dielectric printed circuit board substrate 11, for example. Furthermore, the filter element 1 can be electrically connected to the input of an electrical power converter 2, for example an inverter or a DC-DC converter, by way of connections on the second dielectric printed circuit board substrate 12.

In particular in the case of high electrical power, the electrical filter element 1 can be cooled by means of an active or passive cooling device. In this case, it is in particular also possible to thermally couple the filter element 1 to the electrical power converter 2, in particular to a cooling device of the power converter 2.

In summary, the present invention relates to an electrical filter element for filtering AC voltage interferences. The electrical filter element comprises two dielectric printed circuit board substrates with a magnetic core which is arranged between the printed circuit board substrates. The magnetic core has an inner region which is free from material, in which inner region electrical connection elements are provided between the two dielectric printed circuit board substrates. Furthermore, electrical connection elements can also be provided between the two dielectric printed circuit board substrates in an outer region of the magnetic core.

What is claimed is:

1. An electrical filter element (1), having:
a first dielectric printed circuit board substrate (11);
a second dielectric printed circuit board substrate (12);
an annular magnetic core (13) which is arranged between the first printed circuit board substrate (11) and the second printed circuit board substrate (12);
a number of internal electrical connection elements (21-24) which are arranged in an inner region (13a) of the annular magnetic core (13), wherein each internal electrical connection element (21-24) electrically connects a connecting point on the first printed circuit board substrate (11) to a corresponding connecting point on the second printed circuit board substrate (12);
a first capacitor (51) which is arranged on the first dielectric printed circuit board substrate (11), and which is electrically coupled to a first internal connection element (21) at a first connection and is electrically coupled to a second internal connection element (22) at a second connection.

2. The electrical filter element (1) as claimed in claim 1, wherein the magnetic core (13) comprises at least one core with ferromagnetic particles which are separated from one another.

3. The electrical filter element (1) as claimed in claim 2, wherein the magnetic core (13) also comprises at least one air gap with ferromagnetic particles which are separated from one another.

4. The electrical filter element (1) as claimed in claim 1, having:
a second capacitor (52) which is arranged on the first dielectric printed circuit board substrate (11), and which is electrically coupled to the first internal connection element (21) at a first connection and is electrically coupled to a reference potential (G) at a second connection, and
a third capacitor (53) which is arranged on the first dielectric printed circuit board substrate (11), and which is electrically coupled to the second internal connection element (22) at a first connection and is electrically coupled to a reference potential (G) at a second connection.

5. The electrical filter element (1) as claimed in claim 1, wherein the first printed circuit board substrate (11) comprises a connecting device (40) with a plurality of connecting elements (41, 42), wherein the connecting device (40) is configured to be connected to an electrical voltage source (3), and wherein a respective connecting element (41, 42) is electrically coupled to an internal connection element (21, 22).

6. The electrical filter element (1) as claimed in claim 1, wherein the inner region (13a) of the annular magnetic core (13) is filled with a dielectric filling material.

7. The electrical filter element (1) as claimed in claim 1, wherein the magnetic core (13) has a closed annular structure.

8. The electrical filter element (1) as claimed in claim 1, wherein the magnetic core (13) comprises at least one air gap and/or one core with ferromagnetic particles which are separated from one another.

9. The electrical filter element (1) as claimed in claim 1, having a cooling device which is thermally coupled to the magnetic core (13).

10. An electrical power converter (2) having an electrical filter element (1) as claimed in claim 1.

11. The electrical filter element (1) as claimed in claim 1, wherein the magnetic core (13) comprises at least one air gap with ferromagnetic particles which are separated from one another.

12. The electrical filter element (1) as claimed in claim 1, having a number of external electrical connection elements (31, 32) which are arranged in an outer region of the annular magnetic core (13), wherein each external electrical connection element (31, 32) electrically connects a respective connecting point on the first printed circuit board substrate (11) to a corresponding connecting point on the second printed circuit board substrate (12), wherein the first printed circuit board substrate (11) comprises a first electrically conductive structure (15, 16) which is configured to electrically couple a respective internal electrical connection element (21, 22) with an external electrical connection element (31, 32), and wherein the second printed circuit board substrate (12) comprises a second electrically conductive structure (17, 18) which is configured to electrically couple a respective external electrical connection element (31, 32) to a further internal electrical connection element (23, 24).

13. The electrical filter element (1) as claimed in claim 12, having:

a second capacitor (52) which is arranged on the first dielectric printed circuit board substrate (11), and which is electrically coupled to the first internal connection element (21) at a first connection and is electrically coupled to a reference potential (G) at a second connection, and a third capacitor (53) which is arranged on the first dielectric printed circuit board substrate (11), and which is electrically coupled to the second internal connection element (22) at a first connection and is electrically coupled to a reference potential (G) at a second connection.

14. The electrical filter element (1) as claimed in claim 13, wherein the first printed circuit board substrate (11) comprises a connecting device (40) with a plurality of connecting elements (41, 42), wherein the connecting device (40) is configured to be connected to an electrical voltage source (3), and wherein a respective connecting element (41, 42) is electrically coupled to an internal connection element (21, 22).

15. The electrical filter element (1) as claimed in claim 14, wherein the inner region (13a) of the annular magnetic core (13) is filled with a dielectric filling material.

16. The electrical filter element (1) as claimed in claim 15, wherein the magnetic core (13) has a closed annular structure.

17. The electrical filter element (1) as claimed in claim 16, wherein the magnetic core (13) comprises at least one air gap and/or one core with ferromagnetic particles which are separated from one another.

18. The electrical filter element (1) as claimed in claim 17, having a cooling device which is thermally coupled to the magnetic core (13).

* * * * *